(12) United States Patent
Yamamoto et al.

(10) Patent No.: US 11,854,934 B2
(45) Date of Patent: Dec. 26, 2023

(54) PACKAGE WITH HEAT DISSIPATING SUBSTRATE

(71) Applicants: NGK ELECTRONICS DEVICES, INC., Mine (JP); NGK INSULATORS, LTD., Nagoya (JP)

(72) Inventors: Noriyasu Yamamoto, Sanyo-Onoda (JP); Yoshikazu Mihara, Shimonoseki (JP); Naoya Shirai, Mine (JP)

(73) Assignees: NGK ELECTRONICS DEVICES, INC., Mine (JP); NGK INSULATORS, LTD., Nagoya (JP)

( * ) Notice: Subject to any disclaimer, the term of this patent is extended or adjusted under 35 U.S.C. 154(b) by 18 days.

(21) Appl. No.: 17/700,720

(22) Filed: Mar. 22, 2022

(65) Prior Publication Data

US 2022/0344241 A1 Oct. 27, 2022

(30) Foreign Application Priority Data

Apr. 27, 2021 (JP) .................................. 2021-074850

(51) Int. Cl.
*H01L 23/373* (2006.01)
*H01L 23/367* (2006.01)

(52) U.S. Cl.
CPC ........ *H01L 23/3735* (2013.01); *H01L 23/367* (2013.01)

(58) Field of Classification Search
CPC ........... H01L 23/04; H01L 23/045–047; H01L 23/13; H01L 23/29; H01L 23/293;

(Continued)

(56) References Cited

U.S. PATENT DOCUMENTS

| 5,015,803 A | * | 5/1991 | Mahulikar | ........ | H01L 23/49582 |
| | | | | | 257/668 |
| 7,951,467 B2 | * | 5/2011 | Tsushima | ............... | B23K 20/04 |
| | | | | | 428/635 |

(Continued)

FOREIGN PATENT DOCUMENTS

| JP | 2005-150133 A | 6/2005 |
| JP | 2007-115731 A | 5/2007 |

(Continued)

OTHER PUBLICATIONS

Unexamined U.S. Appl. No. 17/700,717, filed Mar. 22, 2022.
Japanese Office Action received in corresponding Japanese Application No. 2021-074850 dated Sep. 26, 2023.

*Primary Examiner* — Amir A Jalali
(74) *Attorney, Agent, or Firm* — Mattingly & Malur, PC (57) ABSTRACT

A heat sink includes first to fifth layers. The first layer supports a frame made of ceramics, is made of copper, and has a thickness $t_1$. The second layer is laminated to the first layer, is made of molybdenum, and has a thickness $t_2$. The third layer is laminated to the second layer, is made of copper, and has a thickness $t_3$. The fourth layer is laminated to the third layer, is made of molybdenum, and has a thickness $t_4$. The fifth layer is laminated to the fourth layer, is made of copper, and has a thickness $t_5$. A formula $3 \le t_1/t_5 \le 5$ is satisfied. A formula $3 \le t_3/t_5 \le 5$ is satisfied.

5 Claims, 10 Drawing Sheets

US 11,854,934 B2
Page 2

(58) Field of Classification Search
CPC ....... H01L 23/34; H01L 23/36; H01L 23/367; H01L 23/3675; H01L 23/373; H01L 23/3731; H01L 23/3735; H01L 23/49541; H01L 23/49579; H01L 23/49568; H01L 23/49562; H01L 23/49582; H01L 23/49838; H01L 21/52; H01L 21/4882; H01L 21/563; H01L 2224/73265; H05K 1/0306; H05K 1/0296; H05K 7/20; H05K 7/2039; H05K 7/20454; H05K 2201/0999; H05K 2201/10371
See application file for complete search history.

(56) References Cited

U.S. PATENT DOCUMENTS

| | | | | |
|---|---|---|---|---|
| 8,993,121 | B2* | 3/2015 | Nitta | C22C 27/04 428/665 |
| 9,199,433 | B2* | 12/2015 | Nitta | C25D 5/10 |
| 9,922,894 | B1* | 3/2018 | Viswanathan | H01L 23/047 |
| 2004/0246682 | A1* | 12/2004 | Osakada | H01L 23/66 361/709 |
| 2008/0272482 | A1* | 11/2008 | Jensen | H01L 23/3675 257/E23.104 |
| 2009/0258248 | A1* | 10/2009 | Tsushima | B32B 15/018 428/656 |
| 2010/0059271 | A1* | 3/2010 | Yoneda | H01L 23/66 174/548 |
| 2011/0186983 | A1* | 8/2011 | Hasegawa | H01L 23/047 257/E23.181 |
| 2015/0103491 | A1* | 4/2015 | Ma | H01L 24/49 29/840 |
| 2019/0006254 | A1* | 1/2019 | Eblen | H01L 23/40 |
| 2021/0134687 | A1* | 5/2021 | Otomaru | H01L 23/367 |
| 2022/0077011 | A1* | 3/2022 | Tsukiyama | H01L 21/52 |
| 2022/0077033 | A1* | 3/2022 | Tsukiyama | H01L 21/4871 |
| 2022/0344240 | A1* | 10/2022 | Lee | H01L 23/3735 |

FOREIGN PATENT DOCUMENTS

| JP | 2010-219441 W | 9/2010 |
|---|---|---|
| JP | 2018-041868 A | 3/2018 |

* cited by examiner

PACKAGE WITH HEAT DISSIPATING SUBSTRATE

CROSS-REFERENCE TO RELATED APPLICATION

The present application claims priority from Japanese application JP2021-074850, filed on Apr. 27, 2021, the contents of which is hereby incorporated by reference into this application.

BACKGROUND OF THE INVENTION

Field of the Invention

The present invention relates to packages, and, in particular, to a package including a heat sink.

Description of the Background Art

A package having a cavity is often used to store an electronic component, such as a power semiconductor element. After the electronic component is mounted in the cavity of the package, a lid is joined to the package to hermetically seal the cavity. The electronic component is thereby protected against an external environment. Furthermore, the package includes a heat sink to efficiently remove heat from the electronic component. The electronic component is to be mounted on a mounting surface (surface facing the cavity) of the heat sink, and a bottom surface (surface opposite the above-mentioned mounting surface) of the heat sink is typically to be attached to a support member to support the heat sink. The support member is a mounting board or a heat dissipating member, for example. The support member is thermally brought into contact with the bottom surface of the heat sink. Heat from the electronic component is efficiently discharged out of the package (typically to the support member) through the heat sink. Overheating of the electronic component is thereby suppressed.

The temperature of the package increases to approximately 150° C., for example, due to operation of the electronic component. On the other hand, the temperature of the package decreases to a sub-freezing temperature depending on an external environment in which a product including the package is placed. Hermeticity of the package sealed by the lid is thus required to be maintained in a heating cycle corresponding to such a difference in temperature. To verify reliability, a heating cycle test is sometimes conducted at a temperature typically in a range of −65° C. to +150° C.

Japanese Patent Application Laid-Open No. 2005-150133 discloses a semiconductor element storage container. The semiconductor element storage container includes a base (package) and a lid. The base includes a heat sink formed of a metal plate, a ceramic frame, and external connection terminals. The ceramic frame is joined to the heat sink by brazing. As a brazing material, Ag—Cu is used, for example. A semiconductor element is mounted in a cavity portion formed by the heat sink and the ceramic frame. After the semiconductor element is mounted, the lid is joined to the ceramic frame using a resin adhesive, such as an epoxy resin. A cavity is thereby hermetically sealed. The heat sink is formed of a composite metal plate of copper (Cu) plates and other metal plates. To impart high thermal conductivity to the heat sink, the heat sink may have a coefficient of thermal expansion of 8 ppm/° C. or more at a small sacrifice of approximation of the coefficient of thermal expansion of the heat sink to that of the ceramic frame. Japanese Patent Application Laid-Open No. 2005-150133 asserts that, even when the heat sink has such a high coefficient of thermal expansion, reliability of junction between the base and the lid in a heating cycle can be secured as the lid is made of a resin material.

Japanese Patent Application Laid-Open No. 2018-41868 discloses a configuration in which a heat dissipating substrate (heat sink) and a ceramic substrate are joined together by brazing. A problem as described below is disclosed in Japanese Patent Application Laid-Open No. 2018-41868.

The heat dissipating substrate is required to have a coefficient of thermal expansion close to that of a semiconductor device to be joined at a temperature of approximately 150° C. as an operating temperature of the semiconductor device to secure reliability of the semiconductor device. The heat dissipating substrate is thus required to include layers each including metal having a low coefficient of thermal expansion at a volume ratio to the heat dissipating substrate as a whole of more than 10%. The heat dissipating substrate (heat sink) having such a configuration has a lower coefficient of thermal expansion than the ceramic substrate. The ceramic substrate is thus thermally deformed more at a heating temperature (e.g., 800° C.) at brazing during assembly, so that the heat dissipating substrate is warped after cooling.

In view of the above-mentioned problem, Japanese Patent Application Laid-Open No. 2018-41868 described above discloses that, in the heat dissipating substrate including a stack of alternating Cu layers and Mo layers (or W layers), the Cu layers are stacked to be asymmetric along the thickness. Specifically, Japanese Patent Application Laid-Open No. 2018-41868 discloses that a Cu layer disposed near one surface to which the ceramic substrate is joined has a greater thickness than a Cu layer disposed near the other surface opposite the one surface.

According to the study of the inventors, when asymmetry used in technology disclosed in Japanese Patent Application Laid-Open No. 2018-41868 described above is excessive, a package is warped (negative warpage described below) in a direction opposite a direction of warpage caused by brazing (positive warpage described below). Specifically, the package is warped so that the heat sink has a concave bottom surface. Due to the concave warpage, a void is sometimes formed between the center of the heat sink and a support member to support the heat sink. An electronic component is typically mounted near the center of the heat sink, so that the void near the center of the heat sink is likely to interfere with dissipation of heat from the electronic component through the heat sink. As a result, the package can have insufficient heat dissipation performance. In contrast, when the above-mentioned asymmetry is insufficient, an effect of suppressing warpage caused by brazing is not sufficiently obtained.

The positive warpage caused by brazing is more likely to be mitigated when the heat sink including the stack of the Cu layers and the Mo layers includes the Mo layers at a lower volume ratio. According to the study of the inventors, however, reliability of junction (specifically, reliability of junction in a heating cycle at −65° C. to 150° C.) between the package and the lid is less likely to be secured in this case. This problem is likely to be exacerbated when the lid is made of ceramics in contrast to technology disclosed in Japanese Patent Application Laid-Open No. 2005-150133 described above. Specifically, a resin adhesive layer to join the frame and the lid together is likely to be cracked in the heating cycle at −65° C. to 150° C. Furthermore, an excessively low volume ratio of the Mo layers leads to the negative warpage.

The inventors have actually observed a crack as described above as a result of a heating cycle test. When the crack extends between the cavity and external atmosphere, hermeticity of the cavity is lost. The crack is caused by large stress applied when the heat sink has a substantially higher coefficient of thermal expansion than the ceramic frame in the temperature range of the heating cycle. The above-mentioned difference in coefficient of thermal expansion in the temperature range of the heating cycle increases when a material is selected so that priority is given to suppression of the difference in coefficient of thermal expansion between the heat sink and the ceramic frame at approximately 800° C. as a brazing temperature.

As described above, it is difficult to secure reliability of junction in the heating cycle while suppressing warpage of the package caused by brazing using the conventional technology. Furthermore, according to the study of the inventors, the above-mentioned asymmetry of the stack of the heat sink results in insufficient heat dissipation performance from the cavity to the heat sink in some cases. The low thermal conductivity leads to insufficient heat dissipation performance of the package.

SUMMARY

The present invention has been conceived to solve a problem as described above, and it is an object of the present invention to provide a package capable of securing reliability of junction between a frame and a lid while suppressing warpage of the package, and having sufficient heat dissipation performance.

A package according to one embodiment is a package having a cavity to be sealed by a lid, and including a frame and a heat sink. The frame is made of ceramics, and surrounds the cavity in plan view. The heat sink has a support surface to support the frame. The heat sink includes a first layer, a second layer, a third layer, a fourth layer, and a fifth layer. The first layer has the support surface, is made of copper, and has a thickness $t_1$. The second layer is laminated to the first layer, is made of molybdenum, and has a thickness $t_2$. The third layer is laminated to the second layer, is made of copper, and has a thickness $t_3$. The fourth layer is laminated to the third layer, is made of molybdenum, and has a thickness $t_4$. The fifth layer is laminated to the fourth layer, is made of copper, and has a thickness $t_5$. A formula $3 \leq t_1/t_5 \leq 5$ is satisfied. A formula $3 \leq t_3/t_5 \leq 5$ is satisfied.

In the above-mentioned package, a formula $3 \leq t_1/t_5 \leq 4$ may be satisfied.

The ceramics of the frame may have a coefficient of thermal expansion of 5 ppm/° C. or more and 8 ppm/° C. or less from 25° C. to 100° C., and have a coefficient of thermal expansion of 7.5 ppm/° C. or more and 8.5 ppm/° C. or less from 25° C. to 800° C.

In the above-mentioned package, a formula $0.10 \leq (t_2+t_4)/(t_1+t_2+t_3+t_4+t_5) \leq 0.13$ may be satisfied.

The lid may be made of ceramics.

According to one embodiment, when a formula $t_1/t_5 \leq 5$ is satisfied, warpage causing the package including the heat sink and the frame to be excessively convex in the direction from the heat sink to the frame (negative warpage described below) can be suppressed. Furthermore, when a formula $3 \leq t_1/t_5$ is satisfied, warpage causing the package including the heat sink and the frame to be excessively convex in the direction from the frame to the heat sink (positive warpage described below) can be suppressed, and reliability of junction between the frame and the lid can be secured. Furthermore, when a formula $t_3/t_5 \leq 5$ and the formula $3 \leq t_1/t_5$ are satisfied, an excessively small thickness $t_1$ can be avoided. When the thickness $t_1$ is not excessively small, an excessively high resistance for heat flowing from the cavity to the heat sink can be avoided. When the thermal resistance is not excessively high, heat dissipation performance of the package can sufficiently be secured. As described above, reliability of the junction between the frame and the lid can be secured while warpage of the package is suppressed, and sufficient heat dissipation performance can be obtained.

The objects, features, aspects, and advantages of the present invention will become more apparent from the following detailed description and the accompanying drawings.

DESCRIPTION OF THE PREFERRED EMBODIMENTS

An embodiment of the present invention will be described below with reference to the drawings. In description below, a coefficient of thermal expansion (CTE) at a temperature T (° C.) is defined as follows:

$$\{(L_T-L_{25})/(T-25)\}/L_{25},$$

where $L_{25}$ is the length at a temperature of 25° C. (room temperature), and $L_T$ is the length at the temperature T.

In the present description, the above-mentioned coefficient of thermal expansion is also referred to as a coefficient of thermal expansion from 25° C. to T (° C.). The coefficient of thermal expansion of a composite metal plate is calculated based on the length along an in-plane direction. The in-plane direction is herein a direction perpendicular to a direction of a stack (direction of the thickness) of the composite metal plate.

Figure 1:
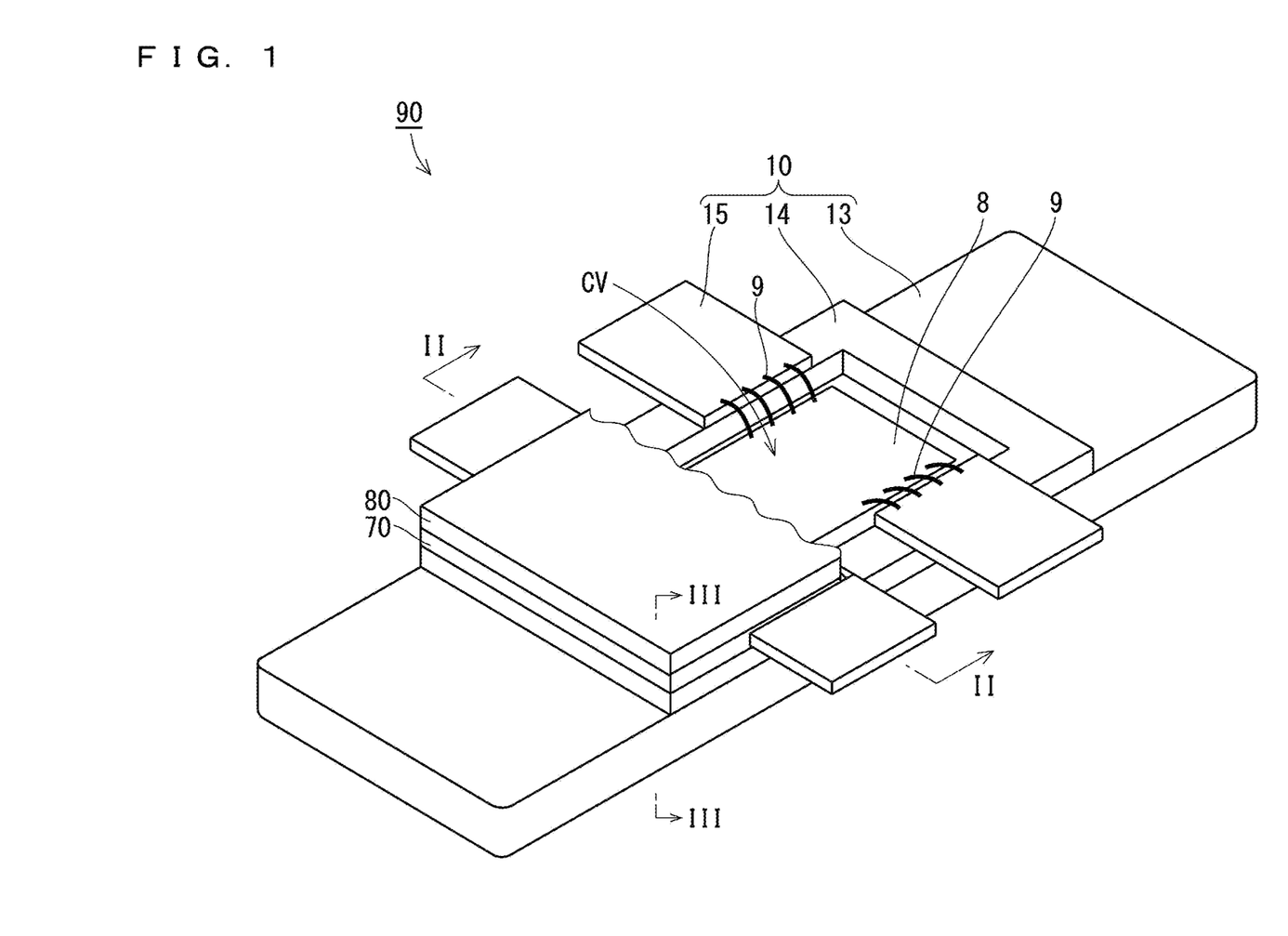
FIG. 1 is a schematic perspective view illustrating a configuration of an electronic device according to one embodiment, with a portion thereof omitted in the figure so that the interior of a cavity is visible.
Figure 2:
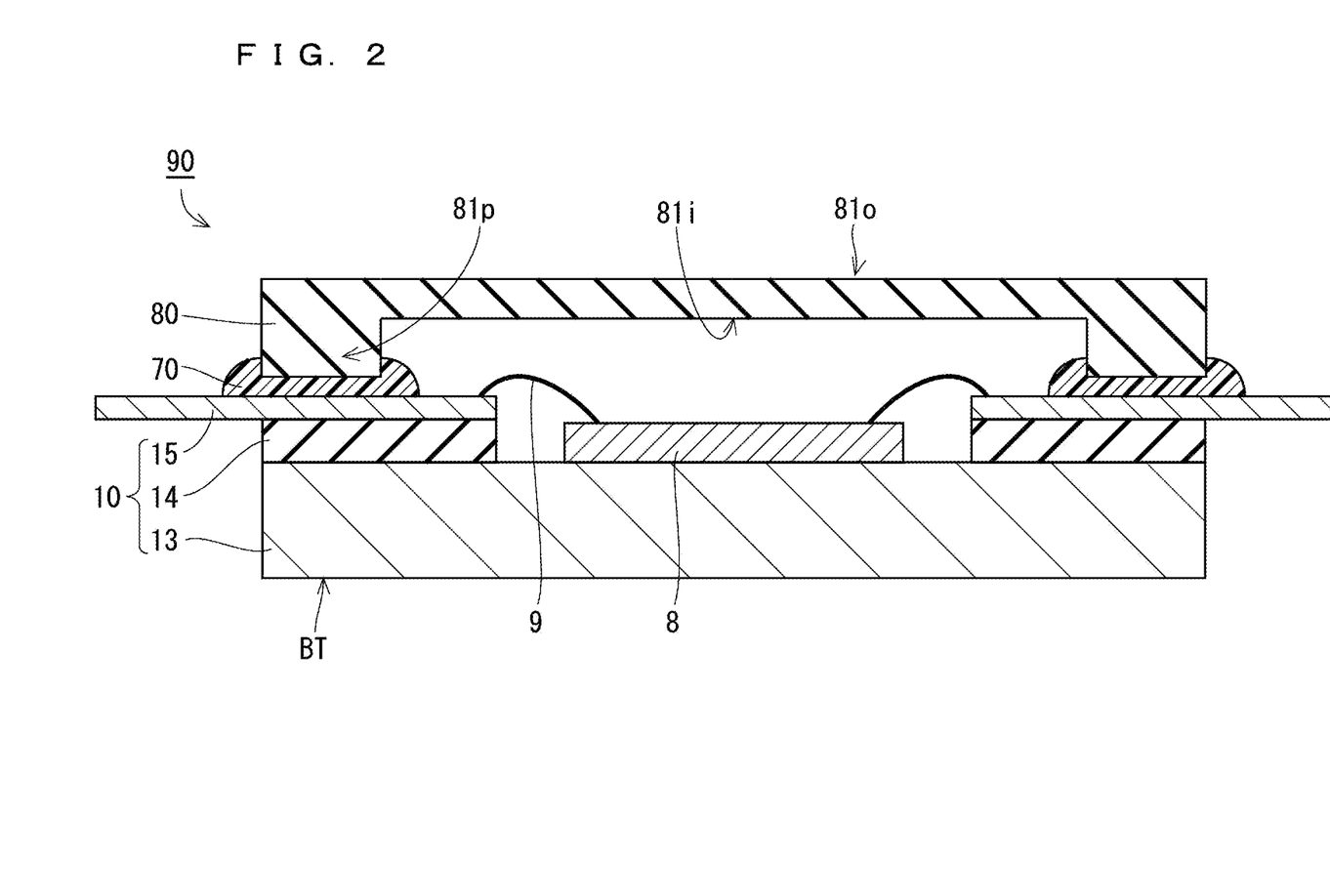
FIG. 2 is a schematic cross-sectional view taken along the line II-II of the electronic device of FIG. 1.
Figure 3:
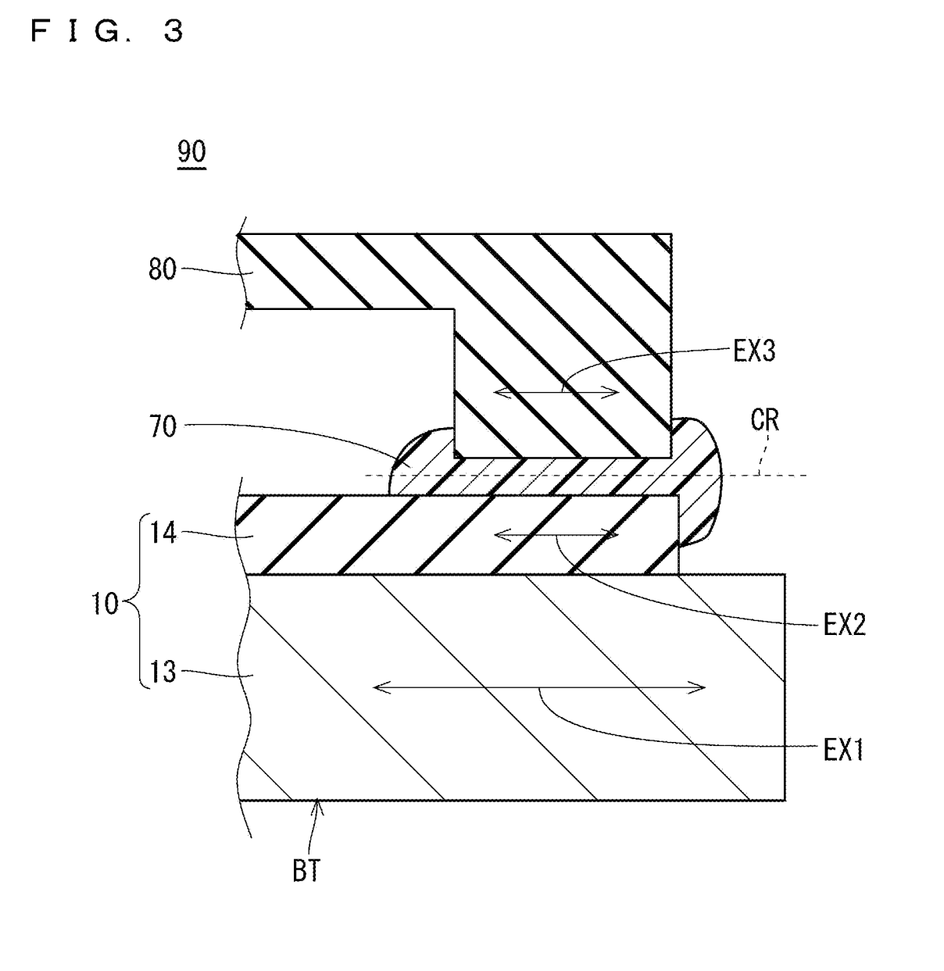
FIG. 3 is a schematic cross-sectional view taken along the line III-III of the electronic device of FIG. 1.

FIG. 1 is a schematic perspective view illustrating a configuration of an electronic device 90 according to the present embodiment, with a portion thereof omitted in the figure so that the interior of a cavity CV is visible. FIGS. 2 and 3 are schematic cross-sectional views respectively taken along the line II-II and the line III-III of the electronic device 90 of FIG. 1.

The electronic device 90 includes a package 10 having the cavity CV, an electronic component 8 disposed within the cavity CV, wires 9, a lid 80, and an adhesive layer 70. The package 10 includes a heat sink 13, a frame 14, and metal terminals 15. The electronic component 8 is a high frequency power semiconductor element, for example, and, in this case, the package 10 is a high frequency package. The electronic component 8 may electrically be connected to the metal terminals 15 of the package 10 by the wires 9. The lid 80 is joined to the frame 14 by the adhesive layer 70 to seal the cavity CV.

The lid 80 may be made of ceramics. The ceramics may contain alumina as a major component. The ceramics may be the same as or different from those for the frame 14.

A material for the lid 80 is not limited to the ceramics. For example, the lid 80 may include a resin material. The resin material is a liquid crystal polymer, for example. Inorganic fillers may be dispersed in the resin material, and the inorganic fillers are silica particles, for example. The inorganic fillers dispersed in the resin material can enhance strength and durability of the lid 80.

In the package 10, the heat sink 13, the frame 14, and the metal terminals 15 may be joined together using a joining material (not illustrated). The joining material is silver solder, for example. Metal layers of tungsten, molybdenum, or the like may be disposed on surfaces of the frame 14 joined to the heat sink 13 and the metal terminals 15 to allow for junction between ceramics and metal using silver solder. The package 10 is typically plated after junction using the joining material.

The frame 14 is disposed on the heat sink 13, and surrounds the cavity CV in plan view. The frame 14 is made of ceramics. The ceramics may have a coefficient of thermal expansion of 5 ppm/° C. or more and 8 ppm/° C. or less from 25° C. to 100° C., and have a coefficient of thermal expansion of 7.5 ppm/° C. or more and 8.5 ppm/° C. or less from 25° C. to 800° C. The ceramics contain alumina as a major component, for example. The frame 14 typically has a greater flexural modulus than the adhesive layer 70.

The metal terminals 15 are joined to the frame 14. The metal terminals 15 form an electrical path connecting the interior and the exterior of the cavity CV sealed by the package 10 and the lid 80. In the cavity CV, the electronic component 8 is electrically connected to the metal terminals 15 by the wires 9. The wires 9 are bonding wires, for example.

The adhesive layer 70 is disposed on the package 10 to surround the cavity CV. Referring to FIG. 1, the adhesive layer 70 may have a portion on the metal terminals 15 and a portion on the frame 14. The adhesive layer 70 has the portion disposed between the frame 14 and the lid 80 to join them together. The portion of the adhesive layer 70 disposed between the lid 80 and the package 10 has a thickness of 100 μm or more and 360 μm or less, for example. The adhesive layer 70 may have a smaller flexural modulus than the lid 80.

The adhesive layer 70 is formed of a thermosetting adhesive in a cured state. The thermosetting adhesive may include at least any of an epoxy resin, a phenolic resin, and a silicone resin as a major component. In particular, the epoxy resin is preferred in terms of a balance of thermal resistance, mechanical strength, and chemical resistance. To suitably have the above-mentioned properties, the thermosetting adhesive in the cured state preferably has a content of the epoxy resin as the major component of 20 wt % to 40 wt % (weight percent), and may include a minor component, such as a curing agent, as the remainder. Specifically, the minor component may be a curing agent of 1 wt % to 10 wt %, inorganic fillers of 50 wt % to 70 wt %, a coupling agent of 0.5 wt % to 2 wt %, a catalyst of 0.5 wt % to 2 wt %, and a low stress agent of 0.1 wt % to 5 wt %, for example. A phenoxy resin compound may be used as the curing agent. Silica may be used as the inorganic fillers. Organic phosphorus or a boron salt may be used as the catalyst. Silicone may be used as the low stress agent.

A bottom surface BT (FIGS. 2 and 3) of the heat sink 13 of the electronic device 90 is to be attached to a support member (not illustrated). The support member is a mounting board or a heat dissipating member, for example. The heat sink 13 may have a through hole (not illustrated) through which a fastener (e.g., a screw) for attachment to the support member passes.

As illustrated in FIG. 2, the lid 80 has an inner surface 81$i$ facing the cavity CV (FIG. 1) and an outer surface 81$o$ opposite the inner surface 81$i$. A frame portion 81$p$ as a protrusion having a frame shape substantially corresponding to a frame shape of the frame 14 is typically provided on the inner surface 81$i$. In this case, the adhesive layer 70 is in contact with the frame portion 81$p$.

A method of manufacturing the electronic device 90 will be described below.

The package 10 is prepared. The electronic component 8 is mounted on the heat sink 13 of the package 10. For example, the electronic component 8 is soldered onto the heat sink 13. Next, the electronic component 8 is electrically connected to the metal terminals 15 by the wires 9.

Next, the lid 80 is mounted over the package 10. Specifically, the lid 80 is attached to the frame 14 of the package 10 through the adhesive layer 70 in a semi-cured state. Next, the lid 80 is pressed against the package 10 at a predetermined load. An appropriate load is dependent on dimensioning of the package 10, and is 500 g or more and 1 kg or less, for example. The adhesive layer 70 is heated during pressing at the load. The heated adhesive layer 70 changes to a softened state first. The viscosity of the adhesive layer 70 is thus reduced. As a result, the adhesive layer 70 wets. With the progress of a curing reaction by heating thereafter, the adhesive layer 70 changes to the cured state. As a result, the lid 80 is joined to the package 10. The cavity CV is thereby sealed.

The electronic device 90 can be obtained as described above.

Figure 4:
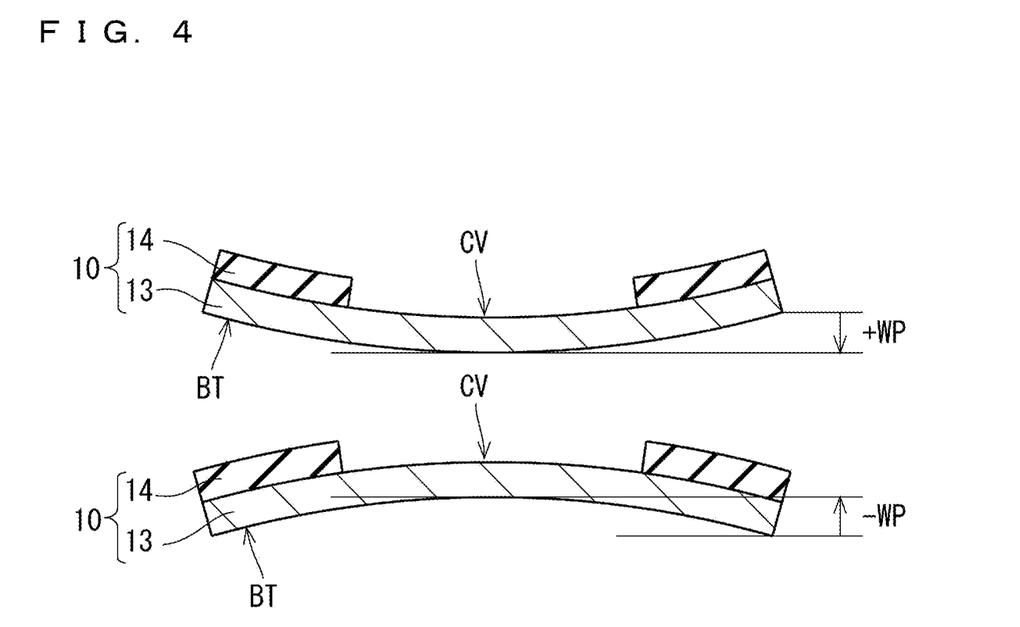
FIG. 4 is cross-sectional views for describing definitions of positive warpage (+WP) and negative warpage (−WP) of the package.

FIG. 4 is cross-sectional views for describing definitions of positive warpage (+WP) and negative warpage (−WP) of the package 10. Referring to the top of FIG. 4, positive warpage of the package 10 is warpage to cause the bottom surface BT of the heat sink to be convex, and the amount of warpage +WP is defined by a protruding dimension of the center from an edge of the bottom surface BT. Referring to the bottom of FIG. 4, negative warpage of the package 10 is warpage to cause the bottom surface BT of the heat sink to be concave, and the amount of warpage −WP is defined by a protruding dimension of the edge from the center of the bottom surface BT.

Measurement results of the amount of warpage described later were obtained by a scheme of bringing the tip of a stylus into direct contact with the surface of a sample. A profilometer (SURFCOM480B from TOKYO SEIMITSU. Co., LTD.) was used as a measurement apparatus.

Figure 5:
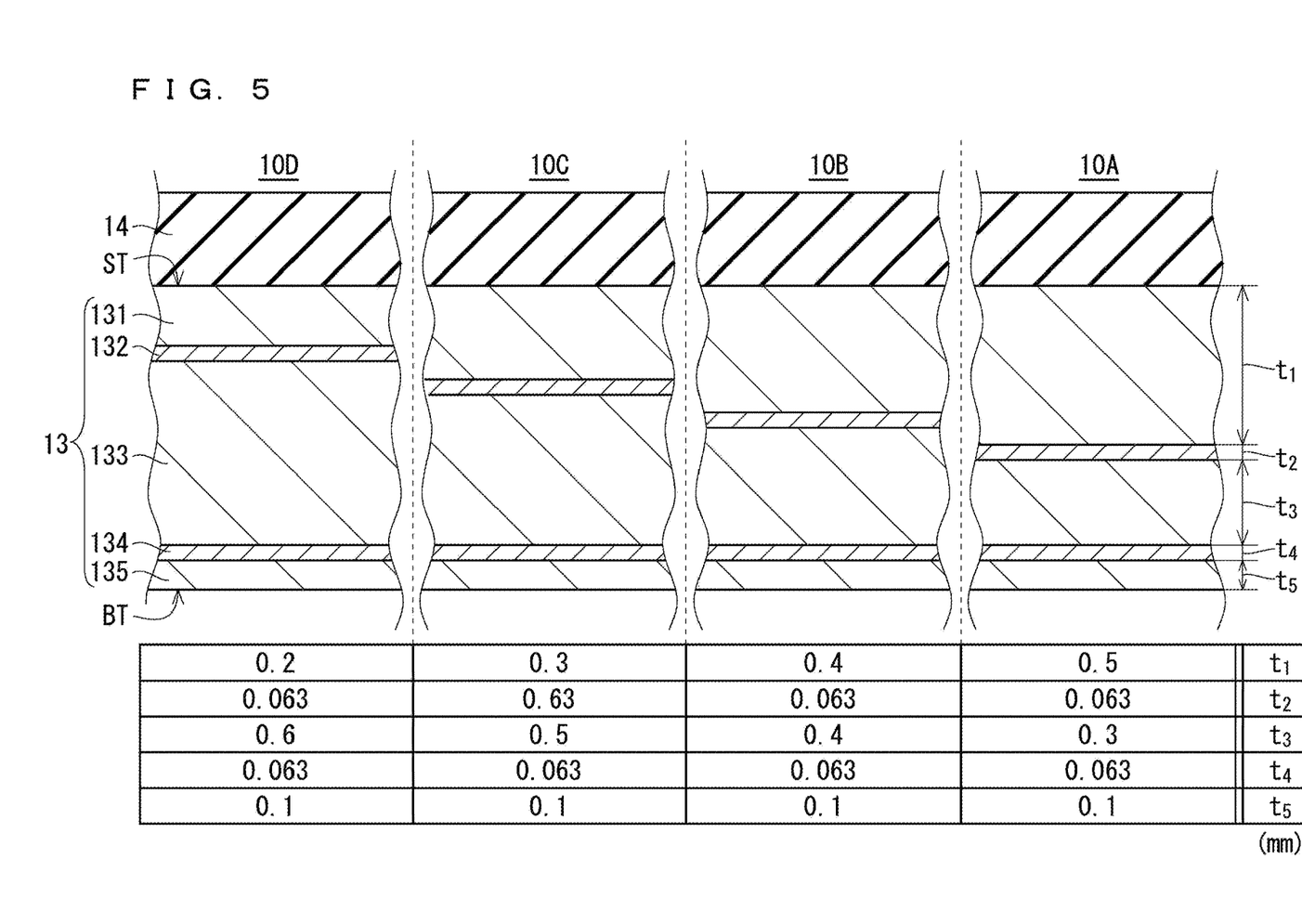
FIG. 5 is partial cross-sectional views illustrating configurations of packages each including a heat sink as examples and a first comparative example.

The top of FIG. 5 is partial cross-sectional views illustrating packages 10A to 10C as examples of the package 10 and a package 10D as a first comparative example. The heat sink 13 has a support surface ST opposite the bottom surface BT. The support surface ST supports the frame 14. Furthermore, the heat sink 13 includes a first layer 131, a second layer 132, a third layer 133, a fourth layer 134, and a fifth layer 135. Specifically, the heat sink 13 is a composite metal plate (cladding plate) having a five-layer structure of the first layer 131 to the fifth layer 135. The first layer 131, the third layer 133, and the fifth layer 135 are made of copper (Cu), and are, in other words, Cu layers. The second layer 132 and the fourth layer 134 are made of molybdenum (Mo), and are, in other words, Mo layers. The first layer 131 has the support surface ST. The second layer 132 is laminated to the first layer 131. The third layer 133 is laminated to the second layer 132. The fourth layer 134 is laminated to the third layer 133. The fifth layer 135 is laminated to the fourth layer 134. The first layer 131, the second layer 132, the third layer 133, the fourth layer 134, and the fifth layer 135 respectively have a thickness $t_1$, a thickness $t_2$, a thickness $t_3$, a thickness $t_4$, and a thickness $t_5$.

The bottom of FIG. 5 shows, for each of the packages 10A to 10D, values (mm) of the thickness $t_1$ of the first layer 131 to the thickness $t_5$ of the fifth layer 135. In each of the packages 10A to 10C, formulas $3 \leq t_1/t_5 \leq 5$ and $3 \leq t_3/t_5 \leq 5$ are satisfied. In particular, in each of the packages 10B and 10C, a formula $3 \leq t_1/t_5 \leq 4$ is satisfied. Furthermore, in each of the packages 10A to 10D, a formula $0.10 \leq (t_2+t_4)/(t_1+t_2+t_3+t_4+t_5) \leq 0.13$ is satisfied. This means that the heat sink 13 including the Cu layers and the Mo layers includes the Mo layers at a volume ratio (i.e., a thickness ratio) of 10% or more and 13% or less. This ratio is hereinafter also referred to as an Mo ratio.

Figure 6:
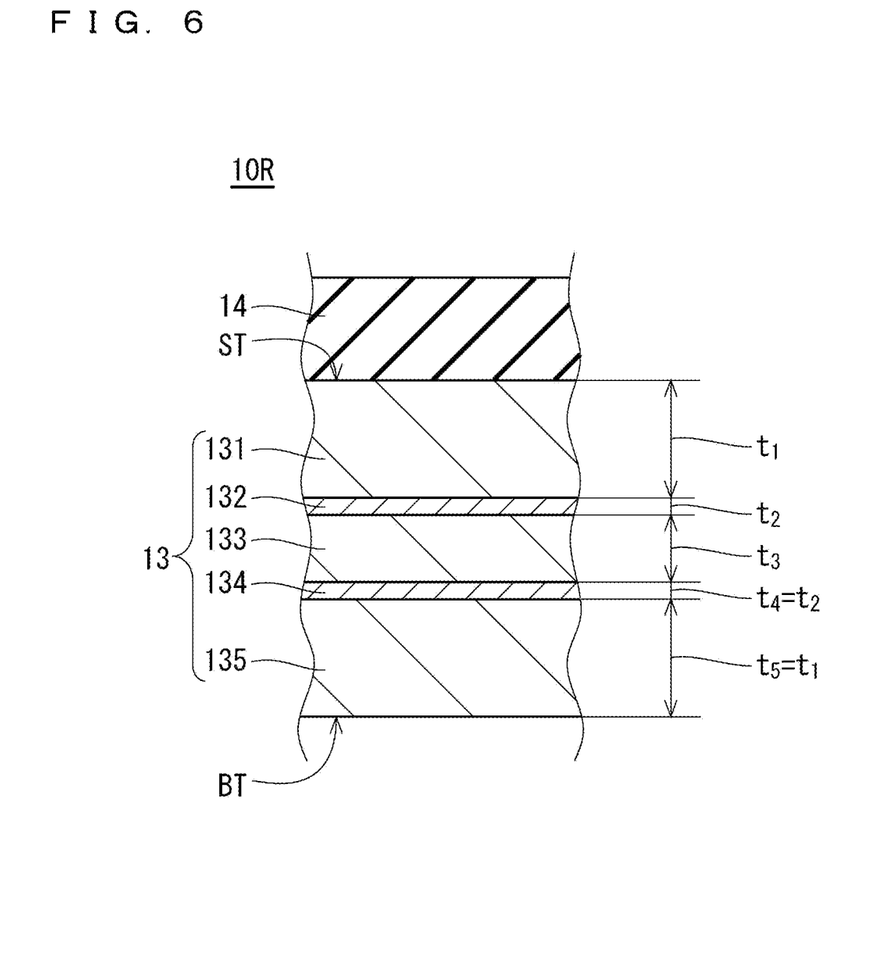
FIG. 6 is a partial cross-sectional view illustrating a configuration of a package of a second comparative example.

FIG. 6 is a partial cross-sectional view illustrating a configuration of a package 10R of a second comparative example. As in a case of FIG. 5, the heat sink 13 of the package 10R includes a stack of alternating Cu layers and Mo layers. In contrast to the case of FIG. 5, however, a stack structure in the package 10R is symmetric along the thickness.

Figure 7:
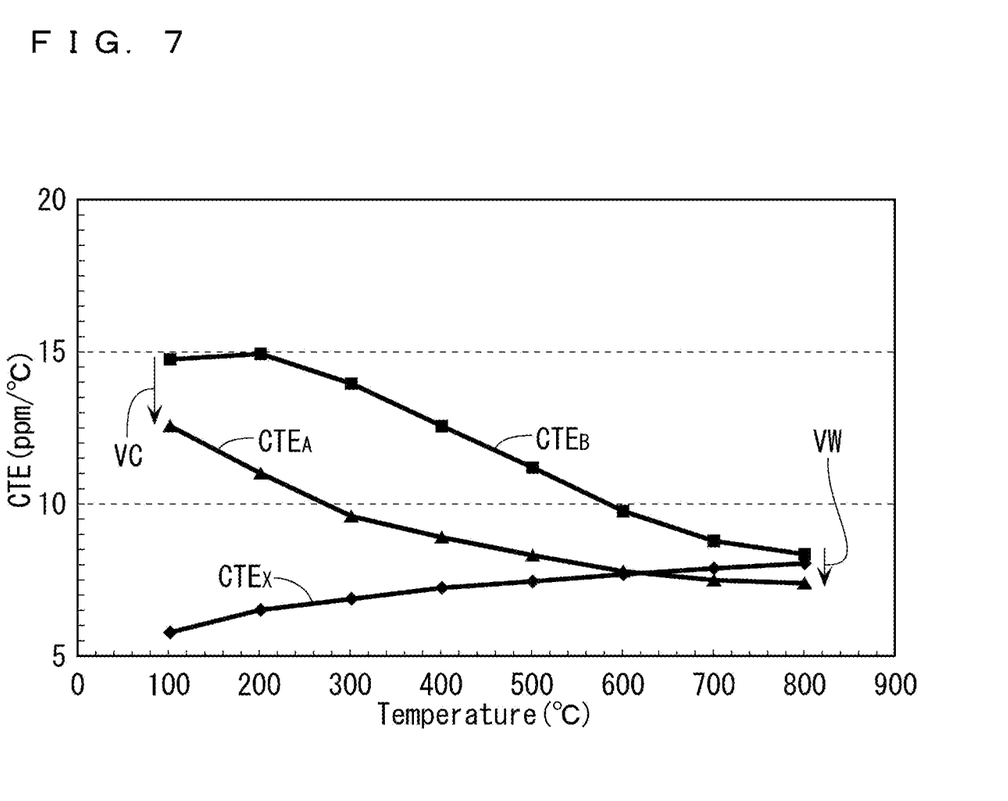
FIG. 7 is a graph showing a coefficient of thermal expansion $CTE_A$ of a composite metal plate (type A) applicable to the heat sink, a coefficient of thermal expansion $CTE_B$ of a composite metal plate (type B) applicable to the heat sink, and a coefficient of thermal expansion $CTE_X$ of a ceramic composition X applicable to the frame.

FIG. 7 is a graph showing a coefficient of thermal expansion $CTE_A$ of a composite metal plate (type A) applicable to the heat sink 13, a coefficient of thermal expansion $CTE_B$ of a composite metal plate (type B) applicable to the heat sink 13, and a coefficient of thermal expansion CTEx of a ceramic composition X applicable to the frame 14. The coefficient of thermal expansion of the composite metal plate as a metal material was measured according to JIS Z 2285, and the coefficient of thermal expansion of the ceramic composition X was measured according to JIS R 1618. The type A and the type B are each a composite metal plate including a stack of alternating Cu layers and Mo layers to have a stack structure symmetric along the thickness (stack structure as illustrated in FIG. 6), but differ in material design thereof. Specifically, the type A has an Mo ratio of 12.3%, and the type B has an Mo ratio of 7.8%.

When high thermal conductivity of approximately 330 (W/m·K) or more and 360 (W/m·K) or less at 25° C. as a reference temperature is intended, the coefficient of thermal expansion of the composite metal plate is adjustable between and around the coefficient of thermal expansion $CTE_A$ and the coefficient of thermal expansion $CTE_B$ depending on the material design. Specifically, properties of a coefficient of thermal expansion in a range of 9 ppm/° C. or more and 15 ppm/° C. or less from 25° C. to 100° C. and properties of a coefficient of thermal expansion in a range of 7.5 ppm/° C. or more and 8.5 ppm/° C. or less from 25° C. to 800° C. can easily be obtained. When the heat sink 13 has a coefficient of thermal expansion of 15 ppm/° C. or less from 25° C. to 100° C., an excessive difference in expansion/contraction between the heat sink 13 and the frame 14 can be avoided.

The coefficient of thermal expansion $CTE_B$ of the composite metal plate is much higher than the coefficient of thermal expansion CTEx of the ceramic material for the frame in a temperature range in a heating cycle (−65° C. to +150° C. in a typical test). Expansion/contraction EX1 is thus much greater than expansion/contraction EX2 as shown in FIG. 3. When the lid 80 is made of ceramics, the expansion/contraction EX1 is greater than expansion/contraction EX3. Stress is applied to the electronic device 90 due to the difference in expansion/contraction. Reliability of junction between the frame 14 and the lid 80 is compromised when the adhesive layer 70 has a crack CR due to the stress in the heating cycle.

To secure reliability of the above-mentioned junction, it is preferable to perform material design of the heat sink 13 so that the heat sink 13 has a lower coefficient of thermal expansion at approximately 100° C. as indicated by an arrow VC (FIG. 7). On the other hand, such material design causes the heat sink 13 to have a lower coefficient of thermal expansion also at approximately 800° C. as indicated by an arrow VW (FIG. 7). The temperature of 800° C. corresponds to the temperature at brazing to join the heat sink 13 and the frame 14 together. Due to the above-mentioned material design, the coefficient of thermal expansion of the frame 14 increases to a non-negligible extent compared with the coefficient of thermal expansion of the heat sink 13 at the temperature at brazing. As a result, it is difficult to avoid excessive positive warpage (FIG. 4: +WP) caused by brazing as long as a symmetric stack structure as illustrated in FIG. 6 is used. As described above, it is difficult to suppress warpage while securing reliability of the junction in the heating cycle in the package 10R of the comparative example.

Figure 8:
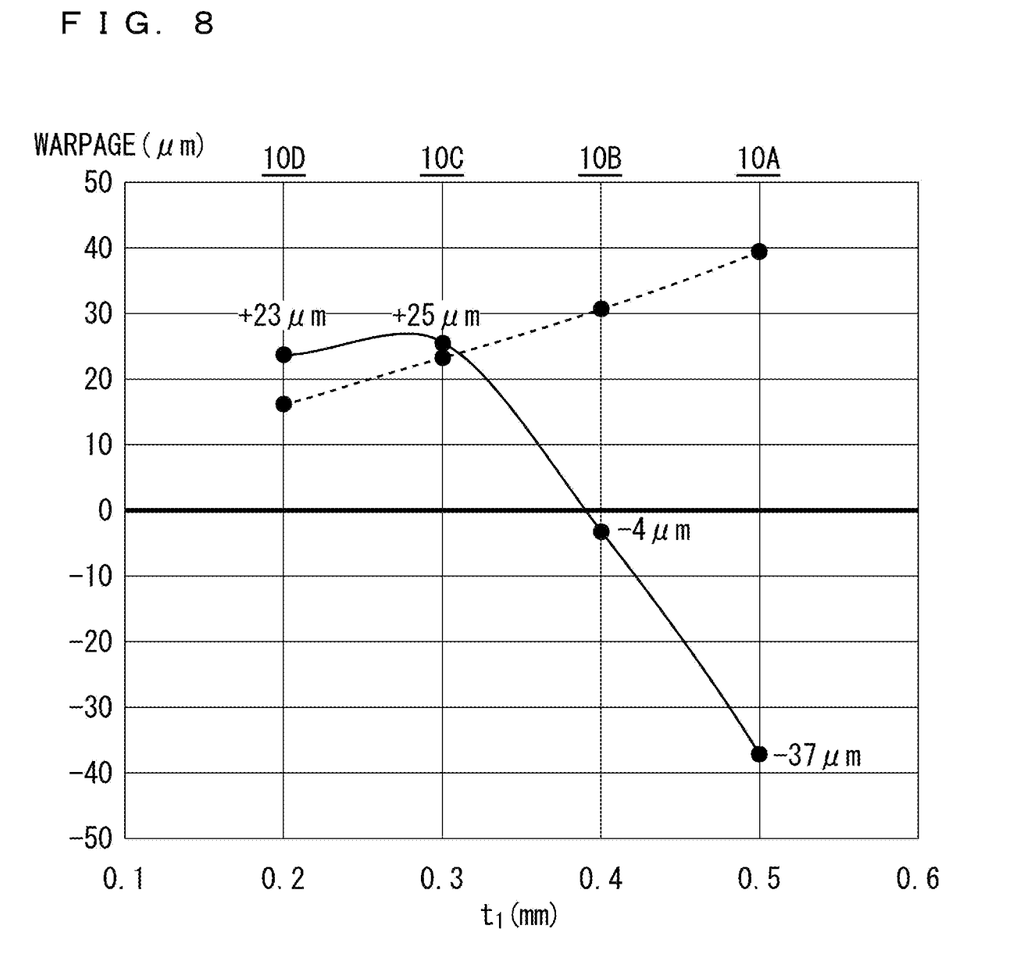
FIG. 8 is a graph showing, in a solid line, results of measurement of warpage of the packages illustrated in FIG. 5 when the ceramic composition X is used as a material for the frame.
Figure 9:
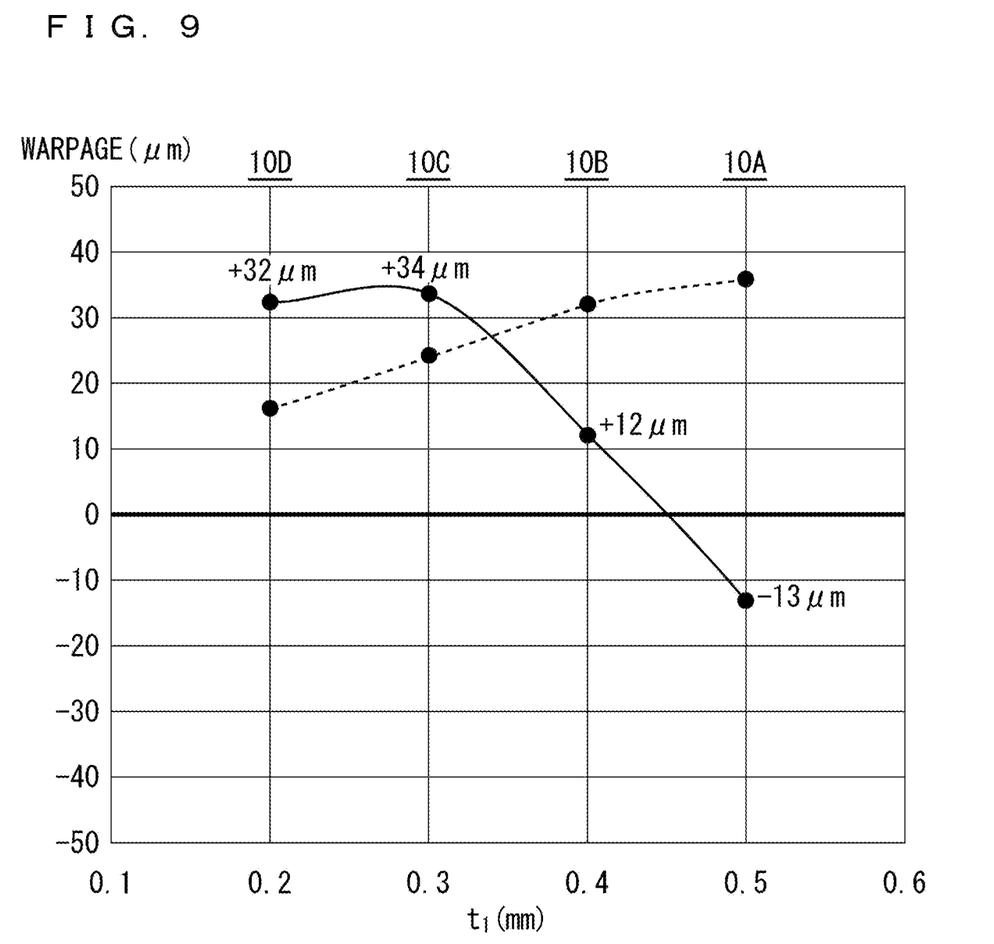
FIG. 9 is a graph showing, in a solid line, results of measurement of warpage of the packages illustrated in FIG. 5 when a ceramic composition Y is used as the material for the frame.

FIG. 8 is a graph showing, in a solid line, measurement results of warpage of the packages 10A to 10D illustrated in FIG. 5 when the ceramic composition X was used for the frame 14, and FIG. 9 is a graph showing, in a solid line, measurement results of warpage of the packages 10A to 10D illustrated in FIG. 5 when a ceramic composition Y was used for the frame 14. The frame 14 had a size expressed by the length×the width×the thickness of 9.4×19.8×0.5 (mm). The heat sink 13 had a size expressed by the length×the width×the thickness of 9.8×20.6×1.026 (mm).

A broken line in each of FIGS. 8 and 9 shows warpage of the heat sink 13 before the manufacture of the packages 10A to 10D, that is, warpage of the heat sink 13 before junction to the frame 14. Before junction to the frame 14, each of bottom surfaces BT opposite a surface to which the frame 14 is to be joined was convex. In other words, each of heat sinks 13 had positive warpage.

The ceramic composition X has a coefficient of thermal expansion of 5.76 ppm/° C. from 25° C. to 100° C., and has a coefficient of thermal expansion of 7.80 ppm/° C. from 25° C. to 800° C. The ceramic composition Y has a coefficient of thermal expansion of 7.10 ppm/° C. from 25° C. to 100° C., and has a coefficient of thermal expansion of 8.30 ppm/°

C. from 25° C. to 800° C. The ceramic composition X is mainly made of alumina, and, specifically, contains alumina at a ratio of 90 wt % or more. The ceramic composition Y contains zirconia at a ratio of approximately 20 wt % while containing alumina as a major material to have a higher coefficient of thermal expansion than the ceramic composition X.

Properties between and around the properties of the ceramic composition X and the properties of the ceramic composition Y can be obtained through adjustment of a material composition, and the material composition adjusted as described above may be used as a material for the frame 14. Specifically, properties of a coefficient of thermal expansion in a range of 5 ppm/° C. or more and 8 ppm/° C. or less from 25° C. to 100° C. and properties of a coefficient of thermal expansion in a range of 7.5 ppm/° C. or more and 8.5 ppm/° C. or less from 25° C. to 800° C. can easily be obtained.

It can be seen, from warpage of the packages 10A to 10D shown in solid lines in FIGS. 8 and 9, that warpage of the package 10 can be adjusted by adjusting the stack structure of the heat sink 13 (FIG. 5).

Furthermore, warpage of the package 10R (FIG. 6) when the ceramic composition X was used and warpage of the package 10R (FIG. 6) when the ceramic composition Y was used were also measured. The following condition was used for the stack structure: the thickness $t_1$ was 0.35 mm, the thickness $t_2$ was 0.063 mm, the thickness $t_3$ was 0.2 mm, the thickness $t_4$ was 0.063 mm, and the thickness $t_5$ was 0.35 mm.

Results of measurement of warpage described above are shown in a table below. The amount of warpage in each of conditions is an average value of values measured for four samples.

warpage (bottom in FIG. 4: −WP) are shown. Negative warpage (bottom in FIG. 4: −WP) is more likely to lead to reduction in heat dissipation performance of the package 10 than positive warpage (top in FIG. 4: +WP), and, from this perspective, the package 10 preferably does not have negative warpage (−WP) of 50 μm or more as the absolute value, and more preferably has zero or positive warpage (+WP). "A" represents a most suitable state of not having negative warpage, "B" represents a state of having negative warpage of less than 5 μm as the absolute value, and "C" represents a state of having negative warpage of 5 μm or more as the absolute value.

In the table above, in a row "TEMPERATURE CYCLE", results of a temperature cycle test at −65° C. to +150° C. to verify reliability of the junction in the heating cycle are shown. "A" represents a state in which reliability is secured in a hermeticity test after 500 cycles, "B" represents a state in which reliability is not secured in the hermeticity test after 400 cycles while reliability is secured in the hermeticity test after 300 cycles, and "F" represents a state in which reliability is not secured in the hermeticity test after 100 cycles. The lid 80 made of ceramics was used in the temperature cycle test.

Experiment Nos. 3 to 10 (asymmetric stack structure) are each expected to have a greater effect of mitigating stress obtained by distortion of Cu than Experiment Nos. 1 and 2 (symmetric stack structure) as a Cu layer facing the frame 14 has a greater thickness $t_1$. Results of the temperature cycle test are thus considered to be substantially equivalent even when the lid 80 is made of resin.

In the table above, in a row "HEAT SINK THERMAL CONDUCTIVITY", results of evaluation of heat dissipation performance from the cavity CV (electronic component 8) to the heat sink 13 are shown. A small thickness $t_1$ means that

TABLE 1

| EXPERIMENT NO. | COMPARATIVE EXAMPLE | | | | EXAMPLE | | | | | |
|---|---|---|---|---|---|---|---|---|---|---|
| | 1 | 2 | 3 | 4 | 5 | 6 | 7 | 8 | 9 | 10 |
| STACK STRUCTURE | 10R | | 10D | | 10C | | 10B | | 10A | |
| $t_1/t_5$ | 1 | | 2 | | 3 | | 4 | | 5 | |
| $t_3/t_5$ | 0.57 | | 6 | | 5 | | 4 | | 3 | |
| CERAMIC COMPOSITION | X | Y | X | Y | X | Y | X | Y | X | Y |
| WARPAGE (μm) | +43 | +51 | +23 | +32 | +25 | +34 | −4 | +12 | −37 | −13 |
| ABSOLUTE VALUE OF WARPAGE | F | F | A | B | A | B | A | A | B | A |
| NEGATIVE WARPAGE | A | A | A | A | A | A | B | A | C | C |
| TEMPERATURE CYCLE | F | B | B | A | B | A | B | A | B | A |
| HEAT SINK THERMAL CONDUCTIVITY | A | | F | | B | | A | | A | |

In the table above, in a row "ABSOLUTE VALUE OF WARPAGE", results of evaluation of the absolute value of warpage are shown. "A" represents a most suitable value of less than 30 μm, "B" represents a slightly large value of 30 μm or more and less than 40 μm, and "F" represents an excessively large value of 40 μm or more. In particular, excessive positive warpage (top in FIG. 4: positive WP) can adversely affect reliability of the junction by increasing stress in the heating cycle. Such warpage of the package can damage the package when the heat sink 13 is fastened to the support member by screwing.

In the table above, in a row "NEGATIVE WARPAGE", results of evaluation to preferably avoid excessive negative a Cu layer of the heat sink 13 facing the cavity CV has a small thickness. In this case, a Cu layer having high thermal conductivity cannot be disposed at a location facing the cavity CV to have a sufficient thickness. As a result, heat dissipation performance from the cavity CV is less likely to be secured. "A" represents no such concern, "B" represents a small concern, and "F" represents a large concern.

When the results of evaluation shown in Table 1 are taken together, Experiment Nos. 5 to 10 are preferable, Experiment Nos. 5 to 8 are more preferable, and Experiment Nos. 7 and 8 are particularly preferable from among the experiment numbers shown in Table 1. The formulas $3 \leq t_1/t_5 \leq 5$ and $3 \leq t_3/t_5 \leq 5$ are required to be satisfied to avoid "F" representing unsuitable evaluation from each perspective.

Specifically, when a formula $t_1/t_5 \leq 5$ is satisfied, excessive negative warpage (bottom in FIG. 4: −WP) can be suppressed. Furthermore, when a formula $3 \leq t_1/t_5$ is satisfied, excessive positive warpage (top in FIG. 4: +WP) can be suppressed, and reliability of the junction between the frame 14 and the lid 80 can be secured. Furthermore, when a formula $t_3/t_5 \leq 5$ and the formula $3 \leq t_1/t_5$ are satisfied, an excessively small thickness $t_1$ can be avoided. When the thickness $t_1$ is not excessively small, an excessively high resistance of heat flowing from the cavity CV to the heat sink 13 can be avoided. When the thermal resistance is not excessively high, heat dissipation performance of the package 10 can sufficiently be secured. As described above, reliability of the junction between the frame 14 and the lid 80 can be secured while warpage of the package 10 is suppressed, and sufficient heat dissipation performance can be obtained.

Experiment Nos. 5 to 8 in each of which the formula $3 \leq t_1/t_5 \leq 4$ is satisfied are more preferable as there is only "A" or "B", and there is not "C" in each of the evaluation items.

Figure 10:
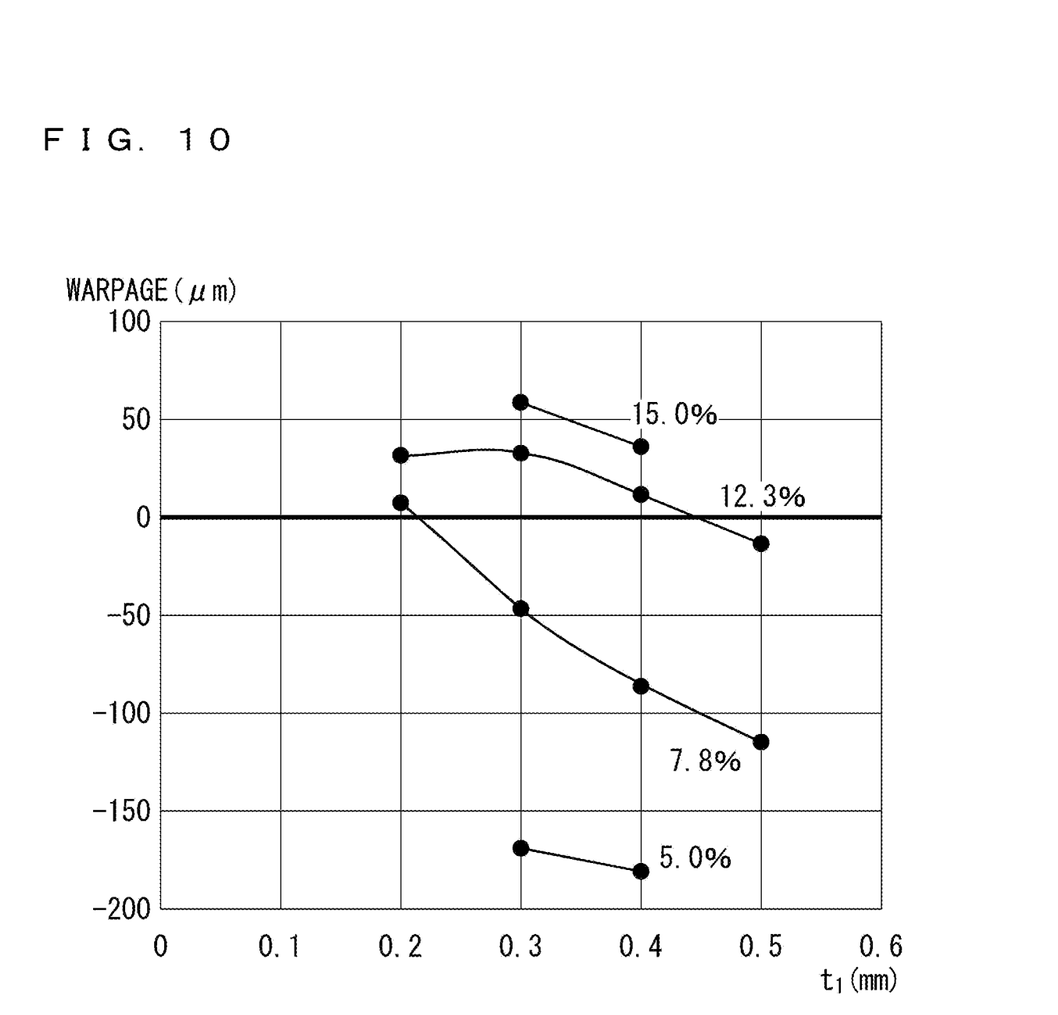
FIG. 10 is a graph showing a correlation between a thickness $t_1$ (mm) of a first layer of each of heat sinks and warpage of each of packages when the heat sinks include Mo at different volume ratios (%) while the ceramic composition Y is used as the material for the frame.

FIG. 10 is a graph showing a correlation between the thickness $t_1$ (mm) of the first layer 131 of each of heat sinks 13 and warpage of each of packages 10 when the heat sinks 13 have different Mo ratios (%) while the ceramic composition Y is used as the material for the frame 14. According to a result of the study of the inventors including the results of the study shown in FIG. 10, the Mo ratio is preferably 10% or more and 13% or less to avoid undesirable warpage. In other words, it is preferable to satisfy the formula $0.10 \leq (t_2+t_4)/(t_1+t_2+t_3+t_4+t_5) \leq 0.13$.

While the invention has been shown and described in detail, the foregoing description is in all aspects illustrative and not restrictive. It is therefore understood that numerous modifications and variations can be devised without departing from the scope of the invention.

What is claimed is:

1. A package having a cavity to be sealed by a lid, the package comprising:
   a frame being made of ceramics and surrounding the cavity in plan view; and
   a heat sink having a support surface to support the frame, the heat sink including:
     a first layer having the support surface, being made of copper, and having a thickness $t_1$;
     a second layer laminated to the first layer, being made of molybdenum, and having a thickness $t_2$;
     a third layer laminated to the second layer, being made of copper, and having a thickness $t_3$;
     a fourth layer laminated to the third layer, being made of molybdenum, and having a thickness $t_4$; and
     a fifth layer laminated to the fourth layer, being made of copper, and having a thickness $t_5$,
   wherein conditions below are satisfied:

$3 \leq t_1/t_5 \leq 5$; and $3 \leq t_3/t_5 \leq 5$.

2. The package according to claim 1, wherein a condition below is satisfied:

$3 \leq t_1/t_5 \leq 4$.

3. The package according to claim 1, wherein
   the ceramics of the frame have a coefficient of thermal expansion of 5 ppm/° C. or more and 8 ppm/° C. or less from 25° C. to 100° C., and have a coefficient of thermal expansion of 7.5 ppm/° C. or more and 8.5 ppm/° C. or less from 25° C. to 800° C.

4. The package according to claim 1, wherein a condition below is satisfied:

$0.10 \leq (t_2+t_4)/(t_1+t_2+t_3+t_4+t_5) \leq 0.13$.

5. The package according to claim 1, wherein the lid is made of ceramics.

* * * * *